Nov. 30, 1965 R. EMEIS ET AL 3,221,219

SEMICONDUCTOR DEVICE HAVING A NICKEL SURFACE IN PRESSURE SLIDING ENGAGEMENT WITH A SILVER SURFACE

Filed Aug. 10, 1962

3,221,219
Patented Nov. 30, 1965

3,221,219

SEMICONDUCTOR DEVICE HAVING A NICKEL SURFACE IN PRESSURE SLIDING ENGAGEMENT WITH A SILVER SURFACE

Reimer Emeis, Ebermannstadt, and Herbert Vogt, Munich, Germany, assignor to Siemens-Schuckertwerke Aktiengesellschaft, Berlin-Siemensstadt and Erlangen, Germany, a corporation of Germany Filed Aug. 10, 1962, Ser. No. 216,707
Claims priority, application Germany, Aug. 12, 1961, S 75,279
14 Claims. (Cl. 317—234)

Our invention relates to rectifiers and other electronic semiconductor devices comprising a semiconductor member of germanium, silicon or an intermetallic semiconductor compound of crystalline constitution, which contains extrinsically conducting zones of respectively different conductance type forming a p-n junction with each other.

It is an object of our invention to provide for a mechanically stable, electrically conducting connection between such an electrode-carrying semiconductor member with an adjacent conducting metal body, such as a component of a capsule or heat sink by means of a purely mechanical pressure contact not requiring any bonding by fusion or similar heat treatment apt to effect the temperature-sensitive properties of the p-n junction semiconductor member or to subject the semiconductor member to ageing due to changes in ambient temperature.

Another object of our invention, subsidiary to the one mentioned above, is to provide a connection of the kind described that also secures the formal as well as electrical permanence, regardless of considerable differences in thermal coefficients of expansion between the crystalline material of the semiconductor member and the adjacent metal body with which the semiconductor member is to be connected.

Still another object of the invention is to provide for encapsulation of a pressure-contacted semiconductor member meeting the above-mentioned objects and to afford giving the capsule structure a particularly simple design and simple mode of assemblage.

According to one of the features of our invention, we connect the semiconductor member, having a metallic electrode surface on one or both sides, with an adjacent contact member in face-to-face engagement with a metal surface of the contact member, and we give the mechanical connecting means such a design that between the mutually engaging metal surfaces of semiconductor member and contact or carrier member there occurs only a glidable or slidable engagement under mutual contact pressure, and that the mutually engaging surfaces are formed substantially of nickel and of silver respectively. The invention takes advantage of the recognition that a pressure engagement between a nickel surface and a silver surface results in a good mutual area contact that permits a gliding displacement or sliding of the two engaging structures relative to each other.

The nickel surface may either constitute an electrode surface of the semiconductor member, and the silver surface may be formed by the adjacent contact or carrier member, or vice versa. One way of providing for the nickel-silver engagement according to the invention is to interpose an insert plate or other structure between the semiconductor member and the contact member proper, the insert consisting of nickel or silver. Two such inserts, one of silver and the other of nickel, may also be used for this purpose. However, the nickel and silver surfaces may also be produced directly on the electrode of the semiconductor member and the contact body respectively by providing the members with a nickel and silver coating respectively. Such a coating can be deposited for example by electroplating or in accordance with a non-electric chemical plating method (electrodeless plating). If desired, such a coating can thereafter be made more permanent and more securely bonded to its substratum by firing or tempering if the temperature necessary for such subsequent treatment is technologically applicable without detriment to the particular member.

There are cases where it is desirable to provide a semiconductor member with a coating of nickel at certain surface areas of zones having a given type of electric conductance in order to provide thereby a surface locality suitable for soldering a wire or other conductor to this particular locality of the semiconductor member. According to our invention, such nickel coatings, heretofore contemplated only for soldering purposes, can immediately be utilized for the particular purposes of the invention, namely for the formation of a slidable surface of nickel which is to be brought together with a slidable surface of silver through the formation of a pressure contact. This is the case, for example, with semiconductor elements that are equipped with doped zones by diffusing the corresponding dopant substances into the semiconductor body and thereafter coating the surface of these particular zones with nickel in order to attach an electric conductor thereto, the coating being deposited, for example, by means of one of the above-mentioned non-electric chemical methods. Such a semiconductor member already possesses a nickel surface. Consequently, it is only necessary to provide the adjacent contact or carrier member, during support of the semiconductor element, with a corresponding silver surface, for example, by depositing a silver coating upon the carrier member or inserting a plate or foil of silver between the carrier and the nickel surface of the semiconductor member.

For securing a particularly good slidability, the respective surfaces that are to engage each other or are to be coated with nickel and silver respectively, are preferably first subjected to lapping in order to make them more accurately planar down to the depth of the roughness determined by the granulation of the lapping medium.

According to another feature of our invention, a mutual pressure contact with nickel-silver slidable surfaces between the semiconductor member and a contact or carrier body are provided not only at one location but in a series arrangement of a plurality of such slidable mutual pressure engagements. One way of doing this is to provide the semiconductor member with a nickel layer at the surface, to provide a second nickel layer on the adjacent contact or carrier member, and to insert between these two nickel surfaces at least one plate or insert member of silver. Conversely, silver surfaces on the two members may thus be employed together with an insert of nickel. Also applicable are sequential inserts consisting alternately of one and the other of the two materials, or consisting each of a lamination of nickel and silver.

For further explaining the invention, reference will be made to the embodiments of electronic semiconductor devices according to the invention, illustrated by way of example in the accompanying drawings, in which.

Figure 1:
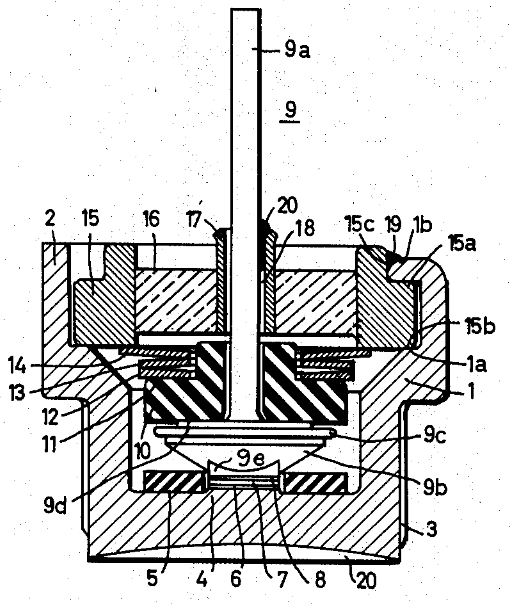
FIG. 1 is an axial section of an encapsuled semiconductor rectifier.
Figure 2:
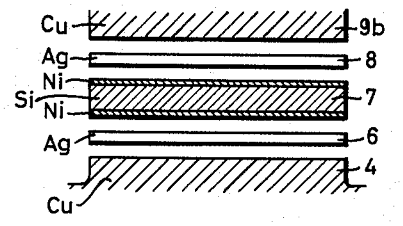
FIG. 2 shows schematically and on a larger scale the details of the same device that are characteristic of our invention.

The capsule of the rectifier illustrated in FIG. 1 comprises a cup-shaped housing 1 of copper. Originally, before assembling the semiconductor device, the housing 1 has a straight cylindrical wall portion 2 as shown at the left in FIG. 1. The cup-shaped housing has its outer peripheral surface provided with grooves or is knurled at 3 so that the housing can be pressure-fitted into the opening of a suitable supporting structure or heat sink. The bottom portion of the housing 1 forms an upwardly protruding base or pedestal 4 whose top is preferably ground or lapped to planar shape.

The pedestal 4 is surrounded by a ring insulating material 5 consisting of heat-resistant material, preferably ceramic, mica or polytetrafluorethylene (Teflon). An insert wafer 6 of silver is placed on top of the base portion 4. Located upon the silver wafer 6 is the semiconductor member 7 proper. The semiconductor member is completely finished before it is assembled with the illustrated encapsulation. The member consists, for example, of a semiconductor disc of silicon in which doped zones are produced adjacent to the top and bottom sides by diffusing corresponding dopants from the surfaces into the silicon body. In this manner, the crystalline semiconductor disc comprises a p-n junction. The top and bottom surfaces of the member are provided with respective nickel coatings. These coatings may be produced by vapor-deposition or by the non-electrical chemical method in order to provide respective contacting surfaces. The semiconductor member 7 thus has its bottom surface formed of nickel and in face-to-face engagement with the top surface of the inserted silver wafer 6. Placed upon the nickel surface on top of the semiconductor member 7 is another inserted silver wafer 8. The housing 1 with its upper portion 2, as well as the bottom portion and the parts 4, 6, 7 and 8 all have a circular shape.

The silver plate 8 is acted upon from above by the lower pressure surface of the massive electric terminal contact denoted as a whole by 9. The contact structure 9 can be forged by means of pressure dies from copper. In the illustrated embodiment it comprises a stem portion **9*a* and a mushroom-shaped portion 9*b*. A pressure block 9*e* is placed upon the external crest area of the mushroom shape and has a planar bottom surface, preferably ground or lapped, which is in face-to-face contact with the silver wafer 8. The mushroom portion 9*b* of the contact structure 9 has a protruding rim 9*c* which results from the pressure-forging process but does not interfere with the use of the structure. The surface of the mushroom portion 9*d* that faces the stem 9*a* is preferably also ground to planar shape. It carries an insulating body 10 of annular shape consisting of one of the above-mentioned materials, for example Teflon. The insulating body 10 has a radially protruding portion 11 upon which three disc springs 12, 13, 14 are seated in coaxial relation to the stem 9*a* and in series relation to each other. The discs have normally arcuate cross-sections and brace themselves against each other at their inner and outer peripheries respectively. Resting upon the outer periphery of disc 14 is a sealing ring 15**.

The interior space of the capsule is sealed from the ambient air by means of an annular body 16 of glass inserted into the sealing ring 15 and centrally traversed by a sealing sleeve 17. The sleeve 17 has some clearance with respect to the stem **9*a* so that at least one capillary gap 18 remains between sleeve and stem into which a molten solder can be inserted and will be sucked by capillary action. The right-hand portion of FIG. 1 indicates how the cylindrical portion 2 of the housing 1 has its upper end bent inwardly over an annular shoulder of the sealing ring 15, thus acting upon the upper shoulder surface 15*a* of the pressure-glass seal and thereby firmly clamping the lower surface 15*b* of ring 15 against a shoulder 1*a* of the housing 1. An additional seal by means of solder 19 is provided between the free surface portion 1*b* of the bent housing portion 2 and the free neck surface 15*c* of ring 15. It will be noted that the glass body 16 not only participates in providing a tight seal but also insulates the pressure-contact structure 9 from the housing 1**.

The above-mentioned soldered seals at 19 and 20 are preferably produced by a single step of operation.

As is apparent from FIG. 1, the external bottom surface 20 of the housing 1 is concave. Such a shape of the housing or base plate for a semiconductor device has been found preferable in cases where the peripheral surface of the housing or carrier is used, as mentioned above, for pressure-fitting the device into an opening of a carrier or heat-sink structure. When the pressure fitting is effected, the base or capsule of the semiconductor device is placed under mechanical tension. By giving the base plate the above-described cavitation at 20, the mechanical stress has the result that the base plate tends to increase its concave curvature toward the interior of the device. Such further deformation has the favorable effect of increasing the tension imposed upon the spring discs 12 to 15. If due to the mentioned mechanical stresses the bottom plate would have the tendency to bend outwardly, such a deformation of the housing might have the opposite effect and thus cause a partial relief of the springs 12 to 14 of the energy stored therein, particularly since the entire deformation of the springs in the axial direction is rather small. As a result it could readily happen that the contact pressure between the nickel and silver surfaces required as reliable minimum value, is no longer secured. It has been found desirable, for example, to maintain the spring pressure about a minimum of 0.5 kilopound per mm.$^2$.

The thermal coefficients of expansion of the semiconductor member 7 regardless of whether it consists of silicon, germanium or a crystalline semiconductor compound on the one hand, and the housing 1 of copper are of such a high magnitude that the semiconductor member would be subject to damage or destruction if its electrode surface were directly joined with the housing. However, if different thermal elongation occurs at respectively different temperatures that the semiconductor device may assume during normal operation, any differences in elongation between the adjacent surfaces of semiconductor member and the housing 1, as well as between the semiconductor member and the contact structure 9 cannot have any detrimental effect upon the semiconductor member. This is so because the connection between these parts does not transmit lateral mechanical forces due to the particularly good ability of the contacting nickel and silver surfaces to permit a sliding motion. Nevertheless, a good electrical and thermal connection between the semiconductor member and the adjacent metal parts and both of its surfaces are reliably preserved under all operating conditions.

For further elucidating the embodiment described above with reference to FIG. 1 and also for facilitating understanding the modifications still to be described with reference to FIGS. 3 to 6, FIG. 2 of the drawings shows in exploded fashion the relative positions of the contact **9*b*, the semiconductor member 7, and the base 4 of the housing 1. With this arrangement, respective inserted layers of silver (Ag) 6 and 8 are located between a nickel layer Ni on the semiconductor member 7 on the one hand, and a body of copper (Cu) 4 or 9*b*** on the other hand.

Figure 3:
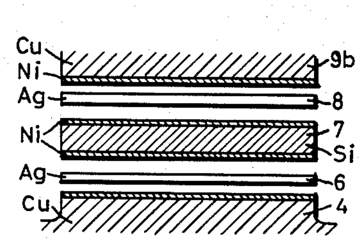
FIGS. 3, 4, 5 and 6 illustrate by similar schematic diagrams four different modifications of such devices respectively.

In the modification shown in FIG. 3, each of the copper bodies 4 and 9 is first provided on its surface with a nickel coating Ni. Thereafter a plate or wafer of silver (Ag) 8 or 6 is inserted between the two nickel layers on each of the respective sides of the semiconductor member.

Figure 4:
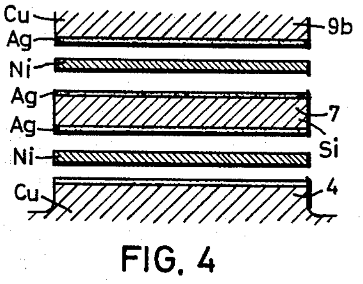

According to FIG. 4, the contact bodies 4, 9 of copper (Cu) have their surfaces coated with silver (Ag). The semiconductor member 7 has its two electrode surfaces also coated with a layer of silver (Ag). A layer or wafer of nickel Ni is inserted between each two mutually adjacent silver layers (Ag).

Figure 5:
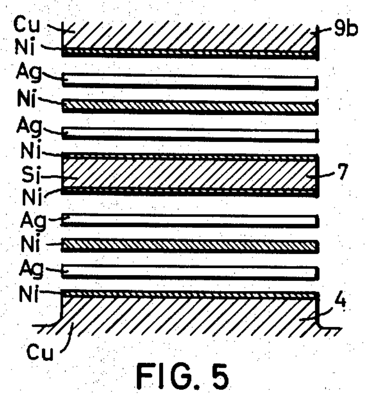

In the embodiment of FIG. 5 the copper contacts 4 and 9 are provided with respective coatings of nickel (Ni). The semiconductor member 7 is provided on both electrode surfaces with coatings of nickel (Ni). Located between each two of these nickel surfaces on the semiconductor member and the adjacent copper body are a series of inserted layers alternately consisting of silver (Ag), nickel (Ni) and silver (Ag).

Figure 6:
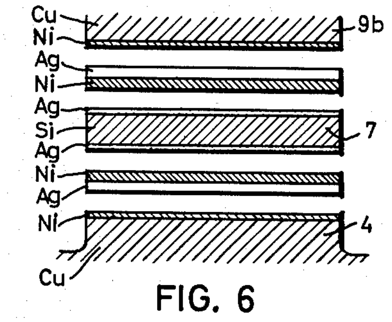

FIG. 6 shows a modification in which the copper bodies 4 and 9 are each provided with a nickel coating whereas the two electrodes of the semiconductor member 7 are provided with respective silver coatings. Located between the mutually adjacent layers of nickel and silver is an insert consisting of two mutually bonded laminations of silver (Ag) and nickel (Ni).

The nickel (Ni) or silver (Ag) surface upon the copper members 4 or 9 in FIGS. 1 to 6 may be joined to the copper members by disposing a wafer or contact body of nickel or silver adjacent to the copper member **9*b* or 4 or both and subjecting the wafer to pressure by the copper members 4, 9*b***, whereby the member enters into a virtually permanent or substantially unslidable connection with the inserted wafer.

In all other respects the embodiments according to FIGS. 3 to 6 may correspond to the device described above with reference to FIG. 1.

It should be noted that in the figures the purpose of ring 5 is to hold members between members 4 and **9*a*** in their stacked positions.

However, it will be obvious to those skilled in the art that our invention permits of a variety of changes and modifications with respect to details in design and arrangement and hence can be given embodiments other than particularly illustrated and described herein, without departing from the essential features of our invention and within the scope of the claims annexed hereto.

We claim:

1. A semiconductor device comprising a semiconductor member having a metallic electrode surface, a contact member adjacent to said semiconductor member and having a metal surface in contact with said electrode surface, said contact member being of material whose thermal coefficient of expansion differs from that of said semiconductor member, pressure means holding said two surfaces in face-to-face slidable engagement with each other, one of said surfaces being formed substantially of nickel and the other substantially of silver.

2. A semiconductor device comprising a semiconductor member having a metallic electrode surface, a contact member adjacent to said semiconductor member and having a metal surface in contact with said electrode surface, said contact member being of material whose thermal coefficient of expansion differs from that of said semiconductor member, pressure means holding said two surfaces in face-to-face slidable engagement with each other, one of said surfaces being formed substantially of nickel and the other substantially of silver, at least one of the nickel and silver surfaces being formed by a coating deposited upon one of said members.

3. A semiconductor device comprising a semiconductor member, a contact member adjacent to said semiconductor member and being of a material whose thermal coefficient of expansion differs from that of said semiconductor member, pressure means for forcing said semiconductor member and said contact member toward each other, a layer assembly intermediate said semiconductor member and said contact member, said layer assembly having two surfaces in face-to-face slidable engagement with each other under the force of said pressure means, one of said surfaces being formed substantially of nickel and the other substantially of silver.

4. A semiconductor device comprising a semiconductor member, a contact member adjacent to said semiconductor member and being of a material whose thermal coefficient of expansion differs from that of said semiconductor member, pressure means for forcing said semiconductor member and said contact member toward each other, a layer assembly intermediate said semiconductor member and said contact member, said layer assembly having two surfaces in face-to-face slidable engagement with each other under the force of said pressure means, one of said surfaces being formed substantially of nickel and the other substantially of silver, said layer assembly including a coating deposited on one of said members, said coating forming one of said surfaces.

5. A semiconductor device comprising a semiconductor member, a contact member adjacent to said semiconductor member and being of a material whose thermal coefficient of expansion differs from that of said semiconductor member, pressure means for forcing said semiconductor member and said contact member toward each other, a layer assembly intermediate said semiconductor member and said contact member, said layer assembly having two surfaces in face-to-face slidable engagement with each other under the force of said pressure means, one of said surfaces being formed substantially of nickel and the other substantially of silver, said layer assembly including a wafer forming one of said surfaces.

6. A semiconductor device comprising a semiconductor member, a contact member adjacent to said semiconductor member and being of a material whose thermal coefficient of expansion differs from that of said semiconductor member, pressure means for forcing said semiconductor member and said contact member toward each other, a layer assembly intermediate said semiconductor member and said contact member, said layer assembly having two surfaces in face-to-face slidable engagement with each other under the force of said presseure means, one of said surfaces being formed substantially of nickel and the other substantially of silver, said layer assembly including two coatings each deposited on one of said members, one of said coatings forming one of said surfaces, a wafer in said layer assembly inserted between said coatings and forming the other of said surfaces.

7. A semiconductor device comprising a semiconductor member, a contact member adjacent to said semiconductor member and being of a material whose thermal coefficient of expansion differs from that of said semiconductor member, pressure means for forcing said semiconductor member and said contact member toward each other, a layer assembly intermediate said semiconductor member and said contact member, said layer assembly having two surfaces in face-to-face slidable engagement with each other under the force of said pressure means, one of said surfaces being formed substantially of nickel and the other substantially of silver, said layer assembly including two coatings each deposited on one of said members, one of said coatings forming one of said surfaces, a plurality of wafers in said layer assembly stacked between said coatings, one of the wafers adjacent said coatings forming the other of said surfaces, said wafers forming with said coatings alternate sheets of silver and nickel having mutually opposing planes.

8. A device as in claim 7 wherein the materials of said planes are in slidable engagement with each other.

9. A semiconductor device comprising a semiconductor member, a contact member adjacent to said semiconductor member and being of a material whose thermal coefficient of expansion differs from that of said semiconductor member, pressure means for forcing said semiconductor member and said contact member toward each other, a layer assembly intermediate said semiconductor member and said contact member, said layer assembly having two surfaces in face-to-face slidable engagement with each other under the force of said pressure means, one of said surfaces being formed substantially of nickel and the other substantially of silver, said plate layer assembly including two coatings each deposited on one of said members, one of said coatings forming one of said surfaces, a wafer in said layer assembly inserted between said coatings and forming the other of said surfaces, said wafer including a lamination of nickel and silver.

10. A semiconductor device comprising a semiconductor member, a contact member adjacent to said semiconductor member and being of a material whose thermal coefficient of expansion differs from that of said semiconductor member, pressure means for forcing said semiconductor member and said contact member toward each other, a layer assembly intermediate said semiconductor member and said contact member, said layer assembly having two surfaces in face-to-face slidable engagement with each other under the force of said pressure means, one of said surfaces being formed substantially of nickel and the other substantially of silver, said semiconductor member having diffusion doped zones, said layer assembly including a nickel coating on one of said zones and forming said nickel surface.

11. A semiconductor device comprising a semiconductor member, a contact member adjacent to said semiconductor member and being of a material whose thermal coefficient of expansion differs from that of said semiconductor member, pressure means for forcing said semiconductor member and said contact member toward each other, a layer assembly intermediate said semiconductor member and said contact member, said layer assembly having two surfaces in face-to-face slidable engagement with each other under the force of said pressure means, one of said surfaces being formed substantially of nickel and the other substantially of silver, said pressure means including a housing for enclosing said semiconductor member and a portion of said contact member, said housing including a pedestal for supporting said semiconductor member and forming another contact member, an insulating ring surrounding the pedestal and the semiconductor member and the plate assembly for securing them in position.

12. A semiconductor device comprising a semiconductor member, a contact member adjacent to said semiconductor member and being of a material whose thermal coefficient of expansion differs from that of said semiconductor member, pressure means for forcing said semiconductor member and said contact member toward each other, a layer assembly intermediate said semiconductor member and said contact member, said layer assembly having two surfaces in face-to-face slidable engagement with each other under the force of said pressure means, one of said surfaces being formed substantially of nickel and the other substantially of silver, said pressure means including a housing for enclosing said semiconductor member and a portion of said contact member, said housing including a pedestal for supporting said semiconductor member and forming another contact member, an insulating ring surrounding the pedestal and the semiconductor member and the layer assembly for securing them in position, said housing having an outer surface terminating in a concave external surface, the outer and external surface being coaxial with said semiconductor member, said pressure means including springs in the housing acting axially upon said semiconductor member whereby when said housing is press-fitted by its outer surface the concave portion is deformed so as to increase the force upon the semiconductor body.

13. A semiconductor device comprising a semiconductor member, a contact member adjacent to said semiconductor member and being of a material whose thermal coefficient of expansion differs from that of said semiconductor member, pressure means for forcing said semiconductor member and said contact member toward each other, a layer assembly intermediate said semiconductor member and said contact member, said layer assembly having two surfaces in face-to-face slidable engagement with each other under the force of said pressure means, one of said surfaces being formed substantially of nickel and the other substantially of silver, a plurality of wafers in said layer assembly stacked between said coatings and forming alternate sheets of nickel and silver having mutually opposed planes, one of said planes forming one of said surfaces.

14. A semiconductor device comprising a semiconductor member having a metallic electrode surface, a contact member adjacent said semiconductor member having a metal surface, said contact member being of material whose thermal coefficient of expansion differs from that of said semiconductor material, an insert disposed between the semiconductor member and the contact member, pressure means holding the contact member, the insert, and the electrode surface in respective physical engagement, said insert having one side engaging said semiconductor electrode surface and a second side engaging said contact member, at least one surface of the said contact member and the said electrode surface being composed of a material selected from the group consisting of silver and nickel, the said first and second sides of the insert being of a material selected from the group consisting of silver and nickel, and at least one side of the insert being of a metal unlike that of the adjacent surface of the contact member and semiconductor member, and at least one side of the insert engaging the said adjacent surface in a sliding physical contact therewith.

References Cited by the Examiner

UNITED STATES PATENTS

| | | | |
|---|---|---|---|
| 2,244,771 | 6/1941 | Figuor | 317—238 |
| 2,712,619 | 7/1955 | Zetwo | 317—234 |
| 2,762,953 | 9/1956 | Beaman | 317—234 |
| 2,817,797 | 12/1957 | Coyle | 317—234 |
| 2,863,105 | 12/1958 | Ross | 317—235 |
| 2,957,112 | 10/1960 | Sils | 317—234 |
| 2,986,678 | 5/1961 | Andres et al. | 317—234 |
| 3,050,667 | 8/1962 | Emeis | 317—234 |

FOREIGN PATENTS

| | | |
|---|---|---|
| 877,674 | 9/1961 | Great Britain. |

JOHN W. HUCKERT, *Primary Examiner.*

JAMES D. KALLAM, *Examiner.*